United States Patent [19]

Chakradhar

[11] Patent Number: 5,555,188

[45] Date of Patent: Sep. 10, 1996

[54] OPTIMAL RETIMING OF SYNCHRONOUS LOGIC CIRCUITS

[75] Inventor: Srimat T. Chakradhar, No. Brunswick, N.J.

[73] Assignee: NEC USA, Inc., Princeton, N.J.

[21] Appl. No.: 365,971

[22] Filed: Dec. 27, 1994

Related U.S. Application Data

[63] Continuation of Ser. No. 73,787, Jun. 8, 1993, abandoned.

[51] Int. Cl.$^6$ ...................................................... G06F 17/50
[52] U.S. Cl. ........................ 364/490; 364/488; 364/489; 364/491
[58] Field of Search ..................................... 364/488–491

[56] References Cited

U.S. PATENT DOCUMENTS

| | | | |
|---|---|---|---|
| 3,617,714 | 11/1971 | Kernighan et al. | 364/488 |
| 4,263,651 | 4/1981 | Donath et al. | 364/300 |
| 4,970,664 | 11/1990 | Kaiser et al. | 364/521 |
| 5,003,487 | 3/1991 | Drumm et al. | 364/489 |
| 5,005,136 | 4/1991 | Van Berkel et al. | 364/490 |
| 5,210,700 | 5/1993 | Tom | 364/489 |
| 5,262,959 | 11/1993 | Chkoreff | 364/489 |
| 5,282,147 | 1/1994 | Goetz et al. | 364/489 |
| 5,287,289 | 2/1994 | Kageyama et al. | 364/489 |

OTHER PUBLICATIONS

Paulin et al., "HAL: A Multi–Paradigm Approach to Automatic Data Path Synthesis," 23rd Design Automation Conference, pp. 587–594.

Keutzer, "DAGON: Technology Binding and Local Optimization by DAG Matching," 24th ACM/IEEE Design Automation Conference, 1987, pp. 341–347.

Pangrle et al., "Design Tools For Intelligent Silicon Compilation," IEEE Transactions On Computer–Aided Design, vol. CAD–6, No. 6, Nov. 1987, pp. 1098–1112.

Marek–Sadowska et al., "Timing Driven Placement," 1989 IEEE, pp. 94–97.

Mahmood et al., "A Formal Language Model of Local Microcode Synthesis," *Formal VLSI Specification and Synthesis:VLSI Design Methods–l*, 1990, pp. 23–41.

*Primary Examiner*—Kevin J. Teska
*Assistant Examiner*—Leigh Marie Garbowski
*Attorney, Agent, or Firm*—Arthur J. Torsiglieri

[57] ABSTRACT

A process for optimally retiming until delay sequential circuits involves first computing the optimal clock period of the circuit by a novel computation method and then relocating the flip flops in the circuit to provide the computed optimal clock period for the circuit. The optimal clock period is computed by viewing the circuit as an interconnection of path segments with pre-specified delays, constructing a path graph of the circuit that has as many vertices as there are latches in the circuit, and formulating an integer linear program to compute the minimum clock period $\phi_{opt}$ for which the path graph has no critical cycles. $\phi_{opt}$ is also the optimal clock period of the circuit.

3 Claims, 2 Drawing Sheets

Table 1: Optimum retiming results

| Circuit | Gates | FFs | Clock Period | | CPU secs | | | |
|---|---|---|---|---|---|---|---|---|
| | | | Initial | Optimal | SIS | COR | | |
| | | | | | | CPLEX | SIS | Total |
| bigkey | 16511 | 224 | 11 | 8 | 29046 | 0 | 66 | 66 |
| clma | 58507 | 33 | 75 | 53 | >3 days | 0 | 265 | 265 |
| clmb | 57639 | 33 | 75 | 53 | >3 days | 0 | 265 | 265 |
| dsip | 5292 | 224 | 15 | 13 | 4437 | 0 | 10 | 10 |
| mm30a | 3484 | 90 | 159 | 159 | 4463 | 0 | 0 | 0 |
| mm4a | 566 | 12 | 25 | 25 | 71 | 0 | 0 | 0 |
| mm9a | 1063 | 27 | 54 | 54 | 306 | 0 | 0 | 0 |
| mm9b | 1274 | 26 | 74 | 61 | 380 | 0 | 1 | 1 |
| mult16a | 539 | 16 | 49 | 8 | 11 | 0 | 0 | 0 |
| mult16b | 392 | 30 | 5 | 5 | 11 | 0 | 0 | 0 |
| mult32a | 1099 | 32 | 97 | 8 | 46 | 0 | 2 | 2 |
| mult32b | 793 | 62 | 5 | 5 | 52 | 0 | 0 | 0 |
| s1196 | 980 | 18 | 20 | 20 | 232 | 0 | 0 | 0 |
| s13207 | 6706 | 501 | 35 | 32 | 9466 | 1 | 11 | 12 |
| s1423 | 1019 | 74 | 55 | 50 | 188 | 0 | 1 | 1 |
| s1488 | 1480 | 6 | 15 | 14 | 246 | 0 | 1 | 1 |
| s1494 | 1504 | 6 | 15 | 14 | 255 | 0 | 1 | 1 |
| s15850 | 8039 | 522 | 47 | 36 | 7763 | 6 | 12 | 18 |
| s208 | 161 | 8 | 10 | 10 | 5 | 0 | 0 | 0 |
| s27 | 17 | 3 | 5 | 5 | 0 | 0 | 0 | 0 |
| s298 | 250 | 14 | 9 | 5 | 3 | 0 | 0 | 0 |
| s344 | 235 | 15 | 14 | 11 | 3 | 0 | 0 | 0 |
| s349 | 241 | 15 | 14 | 11 | 3 | 0 | 0 | 0 |
| s382 | 300 | 21 | 12 | 7 | 3 | 0 | 0 | 0 |
| s38417 | 19882 | 1552 | 31 | 28 | 24445 | 33 | 45 | 78 |
| s38584 | 27710 | 1424 | 37 | 34 | 115255 | 11 | 51 | 62 |
| s386 | 379 | 6 | 11 | 11 | 21 | 0 | 0 | 0 |
| s400 | 320 | 21 | 12 | 7 | 3 | 0 | 0 | 0 |
| s420 | 343 | 16 | 12 | 12 | 20 | 0 | 0 | 0 |
| s444 | 342 | 21 | 13 | 7 | 7 | 0 | 0 | 0 |
| s510 | 438 | 6 | 12 | 11 | 13 | 0 | 0 | 0 |
| s526 | 507 | 21 | 9 | 7 | 10 | 0 | 0 | 0 |
| s5378 | 2994 | 163 | 18 | 13 | 1081 | 0 | 4 | 4 |
| s641 | 342 | 19 | 24 | 24 | 34 | 0 | 0 | 0 |
| s713 | 367 | 19 | 24 | 24 | 37 | 0 | 0 | 0 |
| s820 | 939 | 5 | 14 | 13 | 83 | 0 | 1 | 1 |
| s832 | 967 | 5 | 14 | 13 | 87 | 0 | 1 | 1 |
| s838 | 707 | 32 | 16 | 16 | 98 | 0 | 0 | 0 |
| s9234 | 4832 | 192 | 34 | 21 | 1540 | 1 | 7 | 8 |
| sbc | 1370 | 27 | 15 | 15 | 425 | 0 | 0 | 0 |

Table 1: Optimum retiming results

| Circuit | Gates | FFs | Clock Period | | CPU secs | | | |
|---|---|---|---|---|---|---|---|---|
| | | | Initial | Optimal | SIS | COR | | |
| | | | | | | CPLEX | SIS | Total |
| bigkey | 16511 | 224 | 11 | 8 | 29046 | 0 | 66 | 66 |
| clma | 58507 | 33 | 75 | 53 | >3 days | 0 | 265 | 265 |
| clmb | 57639 | 33 | 75 | 53 | >3 days | 0 | 265 | 265 |
| dsip | 5292 | 224 | 15 | 13 | 4437 | 0 | 10 | 10 |
| mm30a | 3484 | 90 | 159 | 159 | 4463 | 0 | 0 | 0 |
| mm4a | 566 | 12 | 25 | 25 | 71 | 0 | 0 | 0 |
| mm9a | 1063 | 27 | 54 | 54 | 306 | 0 | 0 | 0 |
| mm9b | 1274 | 26 | 74 | 61 | 380 | 0 | 1 | 1 |
| mult16a | 539 | 16 | 49 | 8 | 11 | 0 | 0 | 0 |
| mult16b | 392 | 30 | 5 | 5 | 11 | 0 | 0 | 0 |
| mult32a | 1099 | 32 | 97 | 8 | 46 | 0 | 2 | 2 |
| mult32b | 793 | 62 | 5 | 5 | 52 | 0 | 0 | 0 |
| s1196 | 980 | 18 | 20 | 20 | 232 | 0 | 0 | 0 |
| s13207 | 6706 | 501 | 35 | 32 | 9466 | 1 | 11 | 12 |
| s1423 | 1019 | 74 | 55 | 50 | 188 | 0 | 1 | 1 |
| s1488 | 1480 | 6 | 15 | 14 | 246 | 0 | 1 | 1 |
| s1494 | 1504 | 6 | 15 | 14 | 255 | 0 | 1 | 1 |
| s15850 | 8039 | 522 | 47 | 36 | 7763 | 6 | 12 | 18 |
| s208 | 161 | 8 | 10 | 10 | 5 | 0 | 0 | 0 |
| s27 | 17 | 3 | 5 | 5 | 0 | 0 | 0 | 0 |
| s298 | 250 | 14 | 9 | 5 | 3 | 0 | 0 | 0 |
| s344 | 235 | 15 | 14 | 11 | 3 | 0 | 0 | 0 |
| s349 | 241 | 15 | 14 | 11 | 3 | 0 | 0 | 0 |
| s382 | 300 | 21 | 12 | 7 | 3 | 0 | 0 | 0 |
| s38417 | 19882 | 1552 | 31 | 28 | 24445 | 33 | 45 | 78 |
| s38584 | 27710 | 1424 | 37 | 34 | 115255 | 11 | 51 | 62 |
| s386 | 379 | 6 | 11 | 11 | 21 | 0 | 0 | 0 |
| s400 | 320 | 21 | 12 | 7 | 3 | 0 | 0 | 0 |
| s420 | 343 | 16 | 12 | 12 | 20 | 0 | 0 | 0 |
| s444 | 342 | 21 | 13 | 7 | 7 | 0 | 0 | 0 |
| s510 | 438 | 6 | 12 | 11 | 13 | 0 | 0 | 0 |
| s526 | 507 | 21 | 9 | 7 | 10 | 0 | 0 | 0 |
| s5378 | 2994 | 163 | 18 | 13 | 1081 | 0 | 4 | 4 |
| s641 | 342 | 19 | 24 | 24 | 34 | 0 | 0 | 0 |
| s713 | 367 | 19 | 24 | 24 | 37 | 0 | 0 | 0 |
| s820 | 939 | 5 | 14 | 13 | 83 | 0 | 1 | 1 |
| s832 | 967 | 5 | 14 | 13 | 87 | 0 | 1 | 1 |
| s838 | 707 | 32 | 16 | 16 | 98 | 0 | 0 | 0 |
| s9234 | 4832 | 192 | 34 | 21 | 1540 | 1 | 7 | 8 |
| sbc | 1370 | 27 | 15 | 15 | 425 | 0 | 0 | 0 |

FIG. 4

OPTIMAL RETIMING OF SYNCHRONOUS LOGIC CIRCUITS

This is a continuation of application Ser. No. 08/073,787 filed Jun. 8, 1993 now abandoned.

FIELD OF INVENTION

This invention relates to the manufacture of synchronous logic semiconductor circuits and, more particularly, to a process for modifying the design of a synchronous logic circuit to reduce the clock period needed for its operation without affecting its function.

BACKGROUND OF THE INVENTION

In the operation of electronic circuits of the kind that employ a clock to synchronize successive steps of the circuits' operation, it is desirable to keep the clock period as short as possible (timing optimization) to increase the number of clock cycles that can be carried out in a given time, thereby either to decrease the time to accomplish a given operation or to increase the amount of information that can be generated in a given time.

An important class of such clocked circuits are synchronous logic circuits that are formed by an interconnection of combinational logic gates and clocked flip-flops, generally described as latches. Such circuits, particularly of the VLSI size, currently are designed by computer tools. Such design is typically done by logic synthesis with little concern for timing optimization, concern for which is generally reserved for a later separate redesign stage. Various approaches have been proposed for such retiming stage. Generally, the typical approach involves an iteration of small retiming changes in the design, each followed by a testing step, that can involve many trials before the optimum is reached. Such a retiming process is time consuming.

The making of a series of small incremental changes generally is necessitated by lack of information as to what is the optimal timing that can in practice be realized in the specific circuit under design.

SUMMARY OF THE INVENTION

The present invention relates to the manufacture of synchronous logic circuits that have optimal clock periods for the intended circuit function. A feature of the invention is a process for achieving optimal retiming of a synchronous logic circuit design.

More specifically, the present invention involves a process for optimizing retiming that begins with an initial functional circuit design as in the past, determines in novel fashion the optimal clock period that is possible for the functional circuit design, and then modifies the initial circuit design to provide such optimal clock period. From another aspect the invention may be viewed as a process for making a synchronous logic circuit by using an improved technique for designing the circuit to be manufactured.

To this end, the design process is as follows. First, in one or more preliminary stages, by known techniques there is prepared a preliminary design of a circuit that will provide the logic intended for the circuit and in which redundacies have been substantially eliminated and combinational paths have been shortened to the extent practical by available techniques, so that the design is ready for the optimal retiming technique provided by the invention. Then this preliminary circuit design is specified as an interconnection of combinational logic gates and latches and the optimal clock period for the circuit is then determined by a novel approach that includes viewing the circuit as an interconnection of path segments with prespecified delays and preparing a path graph of the path segments. Path segments are portions of the circuit bounded by latches, primary inputs or primary outputs. Unlike prior retiming approaches that focus on the gates in the circuit, the path segment view focuses on the latches. Determination of the optimal clock period problem is formulated as an integer linear program (ILP). The ILP determines the minimum clock period for which the circuit has no critical paths or cycles. It can be shown that a circuit can be retimed to achieve a given clock period if, and only if, it has no critical paths or cycles. An optimal solution to the ILP is determined from the optimal solution of the corresponding linear program (LP) relaxation. Once the optimal clock period has been found, modification of the circuit design by relocating the latches to achieve operation at the optimal clock period is carried out using known methods. Finally, with the optimal clock period circuit designed, the manufacture of a chip including such design is carried out in the usual fashion.

The invention will be better understood from the following more detailed description taken in conjunction with the accompanying drawing.

BRIEF DESCRIPTION OF THE DRAWINGS

FIG. 4 is a table that illustrates the improvement in computing time of optimal retiming made possible by the invention.

DETAILED DESCRIPTION OF THE DRAWINGS

The design process begins in the usual fashion. By use of known computer programs, there is first prepared a circuit design that accomplishes the desired logic. This initial design may be further refined to eliminate most redundancies and to reduce the length of some of the combinational segments of the circuit before the design reaches the point where the feature of the invention is employed. A this point, the next step is to find the optimal clock period of the circuit available.

To find the optimal clock period of the circuit of interest, there is first prepared a path graph of the circuit. In such a path graph, the circuit is viewed as an interconnection of path segments. A path segment is a portion of the circuit that is bounded at its two ends by a combination of latches, primary inputs or primary outputs. In a path graph, the primary inputs and primary outputs of the circuit are all represented by a common vertex, $l_o$, and each latch $l_i$ in the circuit is represented by a different vertex $l_i$ in the path graph. If there is a combinational path from latch $l_i$ to $l_j$, then the path graph has an arc from vertex $l_i$ to vertex $l_j$ with a weight equal to the maximum path delay from latch $l_i$ to latch $l_j$. The path delay may be viewed as analogous to path length, and the two terms will be used interchangeably. If $l_i$ is a primary input, then there is an arc from $l_o$ to $l_j$. Similarly, if $l_i$ is a primary output, then there is an arc from $l_i$ to $l_o$. Combinational paths between primary inputs and primary outputs are not included in the path graph since the delays on these paths cannot be reduced by retiming. For a similar reason, any self-loop delay, which is the path delay from a latch output to its input, is not included in the graph.

Figure 1:
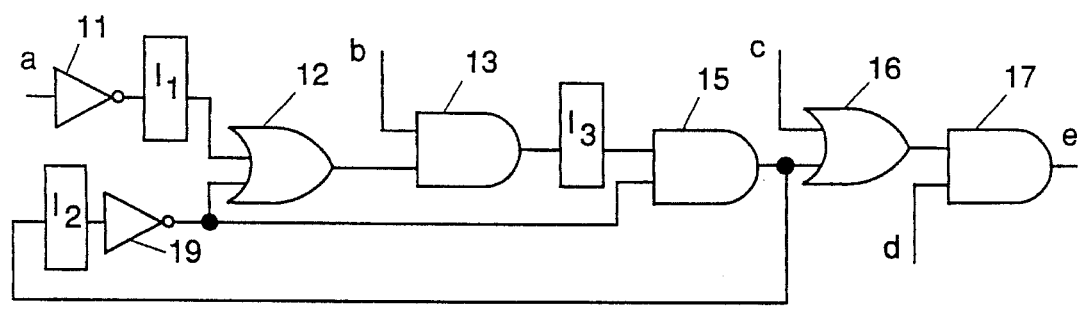
FIG. 1 is a synchronous logic circuit whose optimal clock period is to be found to illustrate the invention.

By way of illustration, consider the circuit 10 shown in FIG. 1. It has four primary inputs labelled a, b, c and d. It has one primary output labelled e. The latches in the circuit are labeled $l_1$, $l_2$ and $l_3$. To avoid races, feedback connections are only allowed through a latch. An assumption is made that all latches are driven by a single clock and that the latching is always triggered by the same edge of a clock pulse, either always the positive or always the negative. It is also assumed that each gate has the same unit propagation delay. Input terminal a supplies an inverter 11 whose output is applied to latch $l_1$ whose output provides one input to OR gate 12. The output of OR gate 12 supplies one input to AND gate 13, the other input of which is input terminal b. The output of AND gate 13 supplies the latch $l_3$ whose output supplies an input to AND gate 15 whose output provides an input to OR gate 16. The input terminal c supplies the other input of OR gate 16 whose output provides one input to AND gate 17 whose output is applied to output terminal e. The other input to AND gate 17 is provided by input terminal d. The output of AND gate 15 is also fed back as the input to latch $l_2$ whose output is supplied as an input to inverter 19 whose output is supplied as an input both to OR gate 12 and to AND gate 15.

Figure 2:
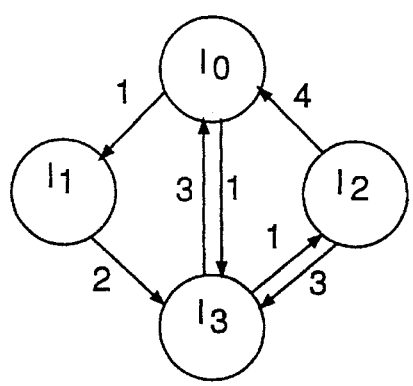
FIG. 2 shows a path graph for the circuit shown in FIG. 1.

The corresponding path graph is shown in FIG. 2. The three vertices $l_1$, $l_2$ and $l_3$ correspond to the three latches. The vertex $l_0$ corresponds to all the primary inputs and outputs of the circuit. There is an arc of weight 1 from vertex $l_0$ to vertex $l_1$ since the path delay along the circuit of the path segment from its nearest primary input to latch $l_1$ is 1. Similarly, since the delay of the path segment from latch $l_2$ along the circuit to the primary output is 4, the path graph has an arc from vertex $l_2$ to $l_0$ with a weight of 4. The weights of the arcs representative of other path segments of the circuit are derived similarly.

Latches in the circuit can be repositioned to alter the path delays in the circuit. Repositioning involves movement of the latches across combinational logic. If a latch is moved forward across combinational logic, then the path delays on all paths originating from the latch are reduced. The direction of latch movement is defined with respect to the signal flow through the latch. If the latch moves in the same direction as the signal flow, then it has moved forward. If the latch moves in a direction opposite to signal flow, then it has moved backwards. Let $x_i$ be the number of time units by which latch $l_i$ is moved forward. If $x_i$ is negative, then the latch has moved $-x_i$ units of time backwards. We denote the movement of primary inputs and outputs as $x_0$. Clearly, $x_0=0$ since the primary inputs and outputs cannot be moved, but let $X_1$, $X_2$ and $X_3$ be the movement of the latches $l_1$, $l_2$ and $l_3$, respectively.

Now, a lower bound on the clock period can be determined easily from the following considerations. Retiming cannot reduce the path delays between primary inputs and outputs. Also, self-loop delays cannot be altered by retiming. Let $D_c$ be the path delay between the longest path segment between a primary input and a primary output. Also, let $D_s$ be the maximum self-loop delay for any latch in the circuit. Both $D_c$ and $D_s$ can be computed in time complexity that is linear in the number of signals in the circuit. Clearly, if $\phi_{opt}$ is the optimal clock period achievable by retiming, then $\phi_{opt} \geq \text{Maximum}(D_c, D_s)$. We will denote $\text{Maximum}(D_c, D_s)$ as $\phi_L$.

Let $\phi$ be the current clock period of the circuit determined by the delay of the longest path segment in the graph. Consider an arc from $l_i$ to $l_j$. Moving latches $l_i$ and $l_j$ alters the arc weight between vertices $l_i$ and $l_j$. If latches $l_i$ and $l_j$ move by $x_i$ and $x_j$ time units, respectively, then the arc weight changes from $d_{ij}$ to $x_j-x_i+d_{ij}$. We refer to $x_j-x_i+d_{ij}$ as the retimed arc weight. If we require a reduction of $\epsilon$ time units, then the latches have to be repositioned so that all retimed arc weights are at most $\phi-\epsilon$. Also, we would like to maximize $\epsilon$ to achieve the smallest possible clock period. The latch movements as well as $\epsilon$ assume only integer values. To compute the maximum value of $\epsilon$, we formulate the following integer linear program ILP to obtain the maximum value for $\epsilon$:

Problem ILP

Maximize $\epsilon$
Subject to $\quad x_j - x_i + \epsilon \leq \phi - d_{ij} \qquad : l_i \Rightarrow l_j \in E$
$\qquad \qquad \epsilon \leq \phi - \phi_L$
All variables are integers.

Obviously, the constraint $\epsilon \leq \phi - \phi_L$ is superfluous. The ILP can be solved without this constraint. If the optimal value of $\epsilon$ exceeds $\phi - \phi_L$, then the optimal clock period is $\phi_L$. Now we establish that the optimal value of $\epsilon$ corresponds to the maximum possible clock period reduction that can be achieved by retiming.

If $\phi$ is the current clock period of the circuit, $\phi_{opt}$ is the optimal clock period achievable by retiming, and $\epsilon$ is the optimal solution to ILP, then $\phi_{opt}=\phi-\epsilon$.

Every critical path or cycle in a circuit corresponds to a cycle in the path graph. Furthermore, a critical cycle in the path graph corresponds to a critical path or cycle of the circuit. It suffices to show that the path graph has no critical cycles for the clock period $\phi-\epsilon$. This is because the absence of critical cycles in the path graph implies that the circuit has no critical paths or cycles for a clock period of $\phi-\epsilon$. It can be shown that if a circuit has no critical cycles or paths, then it can always be retimed to achieve the clock period of $\phi-\epsilon$.

If we consider the optimal solution of ILP, then the path graph has no critical cycles for a clock period of $\phi-\epsilon$. This is because every arc in the path graph now has a retimed arc weight of at most $\phi-\epsilon$. Therefore, the retimed path graph has no critical cycles.

Solving arbitrary integer linear programs is a difficult problem. It belongs to the class of NP-hard problems. However, ILP is a special kind of integer linear program and an optimal solution can be determined fairly quickly. Consider the linear program relaxation of ILP. The objective function and the constraints in the linear program relaxation are identical to ILP. However, we remove the restriction that the variables $x_0, x_1, \ldots, x_k$ and $\epsilon$ are integers. Now they can assume any real value. We will refer to the linear program relaxation problem as LP:

Problem LP

Maximize $\epsilon$
Subject to $\quad x_j - x_i + \epsilon \leq \phi - d_{ij} \qquad : l_i \Rightarrow l_j \in E$
$\qquad \qquad \epsilon \leq \phi - \phi_L$
All variables are free.

If $\epsilon_{LP}$ is the optimal solution to the LP problem, then $\lfloor \epsilon_{LP} \rfloor$ is an optimal solution to the ILP problem.

Since the variables in ILP are restricted to be integers, the optimal solution of ILP is bounded from above by the optimal solution of LP. The largest integer that does not exceed the LP solution is $\lfloor \epsilon_{LP} \rfloor$. It remains to be shown that there exists a set of integer values for the variables $x_0, x_1, \ldots, x_k$ for which the objective function of ILP assumes the value $\lfloor \epsilon_{LP} \rfloor$.

Let $x_0, x_1, \ldots, x_k$ be a set of values corresponding to an optimal solution $\epsilon_{LP}$ for the LP problem. Note that none of the variables may assume an integer value. If we substitute $\epsilon = \lfloor \epsilon_{LP} \rfloor$ in the constraint set of the LP problem, then all constraint inequalities are still satisfied. We can rewrite the LP constraints as the following set of inequalities:

$$l_i \Rightarrow l_j \epsilon E: x_j - x_i \leq \phi - d_{ij} - \lfloor \epsilon_{LP} \rfloor$$

Since $\phi$, $d_{ij}$ and $\lfloor \epsilon_{LP} \rfloor$ are integers, the right hand side of every inequality is an integer. The constraint matrix on the left hand side is unimodular. Therefore, an integer feasible solution is possible and it can be determined either using the Bellman-Ford algorithm or a minimum cost network flow method of the kind described in a book by C. H. Papadimitrio and K. Steiglitz, entitled "Combinatorial Optimization Algorithms and Complexity" Prentice Hall (1982) Englewood Cliffs, N.J. The ILP also assumes its maximum value of $\lfloor \epsilon_{LP} \rfloor$ for this integer solution.

In the light of the foregoing, given a circuit with an initial clock period of $\phi_L$, a fast algorithm for obtaining an optimally retimed circuit consists of the following steps:

1. Construct path graph and determine $\phi_L$.
2. Construct the LP problem. The constraint set has one inequality for every arc in the path graph. Therefore, the LP has |E| constraints and |V| variables.
3. Solve LP using standard linear programming techniques. Let $\epsilon_{LP}$ be the optimal value of the objective function.
4. Retime the circuit to achieve a clock period of $\lfloor \epsilon_{LP} \rfloor$ by using known retiming techniques.

Thereafter, the retimed circuit is operated with the reduced clock period. The principles developed can now be applied to a specific case. Consider again the circuit 10 of FIG. 1. Its clock period needed for operation is $\phi = 4$ since there is a path of this length from latch $l_2$ to primary output e. The lower bound on optimal clock period is 2 because there is a combinational path from primary input c to the primary output e with a path delay of 2. Furthermore, latch $l_2$ has a self-loop delay of 2. Therefore, $\phi_L = 2$.

The path graph for the circuit 10 shown in FIG. 2 has seven arcs and so there are seven path delay constraints. The LP problem for circuit 10 is specified as follows:

Maximize $\epsilon$
subject to
$x_1 - x_0 + \epsilon \leq 3$      $x_3 - x_1 + \epsilon \leq 2$
$x_0 - x_3 + \epsilon \leq 1$      $x_3 - x_0 + \epsilon \leq 3$
$x_3 - x_2 + \epsilon \leq 1$      $x_2 - x_3 + \epsilon \leq 3$
$x_0 - x_2 + \epsilon \leq 0$      $\epsilon \geq 2$
All variables are free.

Figure 3:
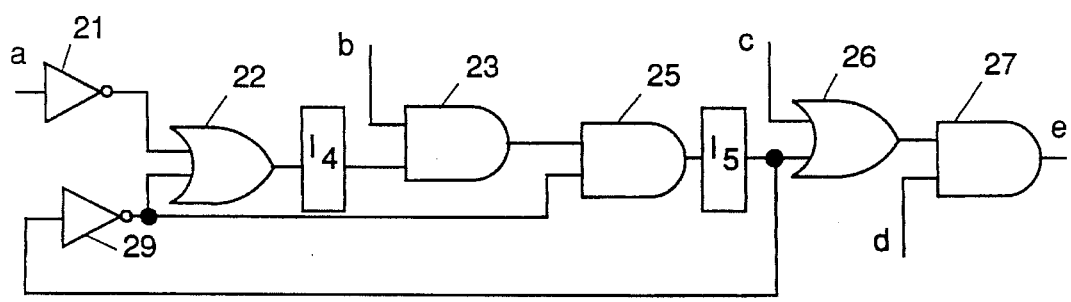
FIG 3 shows a functionally equivalent circuit of FIG. 1 after it has been retimed in accordance with the design feature of the invention.

If we solve LP using any of the many available linear programming commercial packages, the optimal value of $\epsilon$ is found to be 2. Therefore, the optimal clock period $\phi_{opt} = \phi - \epsilon = 4 - 2 = 2$. With knowledge that the optimal clock period possible for circuit 10 is 2, it is a relatively simple matter for a circuit designer to retime the circuit to achieve a clock period of 2. FIG. 3 shows the retimed circuit 20, which is functionally equivalent to circuit 10, but which needs only a clock period of 2. Various tools are available for doing the retiming with the aid of a computer, as is discussed below.

However, in the relatively simpler circuit forming the illustrative example, an experienced designer knowing that a clock period of two units is not only optimal but feasible, could quickly determine without the need of a computer, the changes necessary in the preliminary design to achieve the desired optimally retimed configuration shown in FIG. 3. In the circuit 20 of FIG. 3, gates have been numbered ten higher than their corresponding gate in the circuit 10 of FIG. 1 and latch $l_4$ has been inserted between the output of OR gate 22 and one input to AND gate 25 and latch $l_5$ has been inserted between the output of AND gate 25 and both the feedback loop to inverter 29 and one input to OR gate 26. This configuration will operate with a clock period of two units of delay.

The proposed optimal retiming technique has been implemented in a C programming language program call COR (compute optimal retiming). The prototype implementation consists of two phases: (1) computation of optimal clock period and (2) computing a feasible retiming for the optimal clock period. We solve the linear program in the optimal clock period computation phase of COR by using a commercial linear programming package called CPLEX available from CPEX Optimization, Inc. Incline Village, NV89451-9436. A feasible retiming for the optimal clock period is determined using the unit delay retiming tool that is part of the logic synthesis framework SIS described in a paper entitled "Sequential Circuit Design Using Synthesis and Optimization" published in IEE Conf. on Computer Design, pp. 328–333 October, 1992. The retiming tool in SIS implements an iterative relaxation algorithm which is the fastest known method for obtaining a feasible retiming for a given clock period.

Table 1 shows the experimental results on several ISCAS '89 and MCNC sequential benchmark circuits. All results were obtained by running COR on a Sparc2 workstation. Every circuit was converted into a circuit that consists of only two-input NAND gates by using the tech$_{13}$ decomp -a 2 program in SIS. The circuit obtained after using tech_decomp is the initial circuit for our experiments. The number of gates and the number of latches in the circuit are shown under columns Gates and FFs, respectively. This data is included to give an idea about the size of the circuits.

For every circuit, we performed two experiments. The optimally retimed circuit was independently obtained using COR as well as the optimal retiming tool in SIS. Under the column Clock Period, we show the initial clock period of the circuit in column Initial. The optimal clock period determined by COR is shown in column Optimal. These values agree with the optimal clock periods reported by the retiming tool in SIS. Under the column CPU secs, we report the computation times (CPU seconds) for the retiming tool in SIS. For some large circuits like clma and clmb, we aborted the SIS runs after they ran for over three days. The CPU times for COR are shown in three columns. Under column CPLEX, we show the amount of time spent in solving the linear program to determine the optimal clock period. Computing times smaller than a CPU second are shown as 0. Once the optimal clock period is determined, the retiming tool in SIS is used to determine a feasible retiming. Column SIS shows the number of CPU seconds required to determine a feasible retiming. The sum of CPLEX and SIS times for COR are shown in column Total.

As an example, consider the circuit s38584. This circuit has 27,710 logic gates and 1,424 latches. The initial clock period of the circuit is 37. The optimal clock period that can be achieved by retiming is 34. The retiming tool in SIS without use of the invention required 115,225 CPU seconds to obtain an optimally retimed circuit. In contrast, the process of the invention required only 62 seconds. In particular, the optimal clock period was computed by solving the linear program in only 11 seconds and the remaining 51 seconds were required by the retiming tool in SIS to determine a feasible retiming.

Our experimental results reported in the table clearly demonstrate the superiority of the proposed technique. The performance of COR is several orders of magnitude faster than the retiming tool in SIS for almost all circuits.

Once there has been realized the optimal design for the circuit, conventional techniques can be used for the manufacture of the circuit.

It is to be understood that the specific example described is merely illustrative of the basic principles of the invention.

What is claimed is:

1. A process for designing a synchronous logic circuit that includes an interconnection of logic gates and clocked flip flops so as to have an optimal clock period that includes the steps of
    preparing a preliminary design that provides the structural features of said circuit, said design including a plurality of path segments, each bounded at its ends by a combination of clocked flip flops, primary inputs, or primary outputs,
    preparing a path graph of said design in which path graph each clocked flip flop appears as a separate vertex, the primary inputs and primary outputs collectively form another vertex, and the path segments appear as arcs with the delays of the path segments as weights of their respective arcs,
    determining the minimum clock period for which the circuit has no critical paths or cycles by setting up an integer linear program and then computing the optimal solution to the integer linear program as a solution of its corresponding linear program relaxation with the longest delay arc and path delays as constraints, and
    retiming the preliminary design in the light of said optimal solution by repositioning the clock flip-flops to achieve a circuit design with an improved delay.

2. The process of making a synchronous logic circuit that includes the steps of designing a synchronous logic circuit in accordance with claim 1 and then fabricating a circuit in accordance with such design.

3. A process for designing a synchronous logic circuit that includes an interconnection of logic gates and clocked flip flops so as to have an optimal clock period that includes the steps of:
    preparing a preliminary design of the synchronous circuit with some clock period,
    preparing a path graph that has a vertex for every latch in the circuit, and one single vertex for all primary input and primary outputs of the circuit, and it has an arc from one vertex to another if the corresponding clocked flip flops, primary inputs or primary outputs, have a combinational path between them,
    determining for each arc the delay of the path segment with the longest delay between the two vertices at the extremities of the arc,
    formulating an integer linear program (ILP) that has an integer valued variable for every vertex in the path graph, has one integer valued variable that corresponds to optimal clock period, and has as many inequalities as there are arcs in the path graph, and every inequality ensures that the integer values assumed by variables are such that the delay on the path segment with the longest delay is less than or equal to the value assumed by the integer variable representing the optimal clock period,
    computing the optimal solution of the ILP by constructing a relaxed problem where every variable in the ILP can assume both integer and non-integer values as opposed to only integer values, and solving the relaxed problem using linear programming methods to obtain the optimal fractional value for the variable that corresponds to the optimal clock period, and computing the optimal clock period for the circuit to be the largest integer that is less than the fractional value obtained as the solution to the relaxed problem, and
    retiming the preliminary design by repositioning the clocked flip flops in the light of the said optimal clock period to achieve a sequential logic circuit that has the smallest possible clock period.

* * * * *